Figure 1:
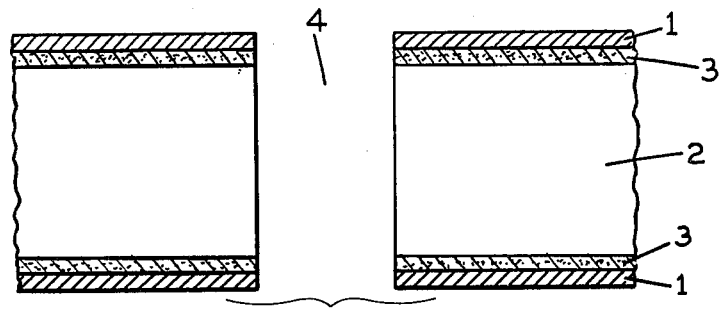

United States Patent [19]

Stahl et al.

[11] 4,374,868

[45] Feb. 22, 1983

[54] METHOD FOR PRODUCING PRINTED CIRCUIT BOARDS WITH PUNCHED HOLES HAVING METALLIZED WALLS

[75] Inventors: Fritz Stahl, Tonisvorst; Horst Steffen, Geldern-Pont, both of Fed. Rep. of Germany

[73] Assignee: Kollmorgen Technologies Corporation, Dallas, Tex.

[21] Appl. No.: 239,385

[22] Filed: Mar. 2, 1981

[30] Foreign Application Priority Data

Mar. 4, 1980 [DE] Fed. Rep. of Germany ....... 3008143

[51] Int. Cl.³ .......................... H05K 3/18; H05K 3/42
[52] U.S. Cl. ....................................... 427/97; 156/631; 156/668; 156/902; 204/15; 427/98
[58] Field of Search ....................... 156/902, 631, 668; 427/97, 98; 204/15

[56] References Cited

U.S. PATENT DOCUMENTS

| | | | |
|---|---|---|---|
| 3,620,933 | 11/1971 | Grunwald et al. | 156/902 |
| 4,001,466 | 1/1977 | Shaul | 427/98 |
| 4,162,932 | 7/1979 | Konicek | 156/902 |
| 4,217,182 | 8/1980 | Cross | 427/98 |

OTHER PUBLICATIONS

Alpaugh et al., "Hole Cleaning of High Aspect Ratio Through-Holes in Printed Circuit Boards", IBM TDB 79, No. 8, Jan. 77.

Davey, "Plasma Desmearing", Finishing Industries, Aug. 1981.

Primary Examiner—John D. Smith
Attorney, Agent, or Firm—Morgan, Finnegan, Pine, Foley & Lee

[57] ABSTRACT

A method for producing printed circuit boards with holes having walls provided with a metal coating on base material provided with an adhesive layer which, in turn, is covered by a masking foil composed of plastic material or metal. Following the preparation of the pattern of holes and prior to the removal of the masking foil, the layer of adhesive coating is removed at the edges of the holes by chemical action, so that an annular zone free of adhesive is formed underneath the masking foil. The masking foil is subsequently removed and the metallization of the pattern of conductors and walls of the holes is produced by currentless deposition alone or combined with galvanic precipitation.

4 Claims, 7 Drawing Figures

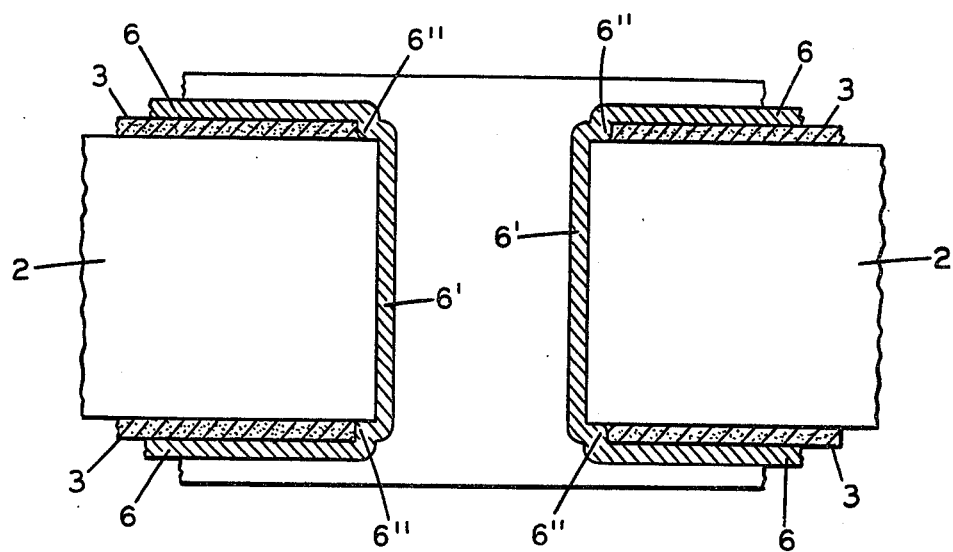
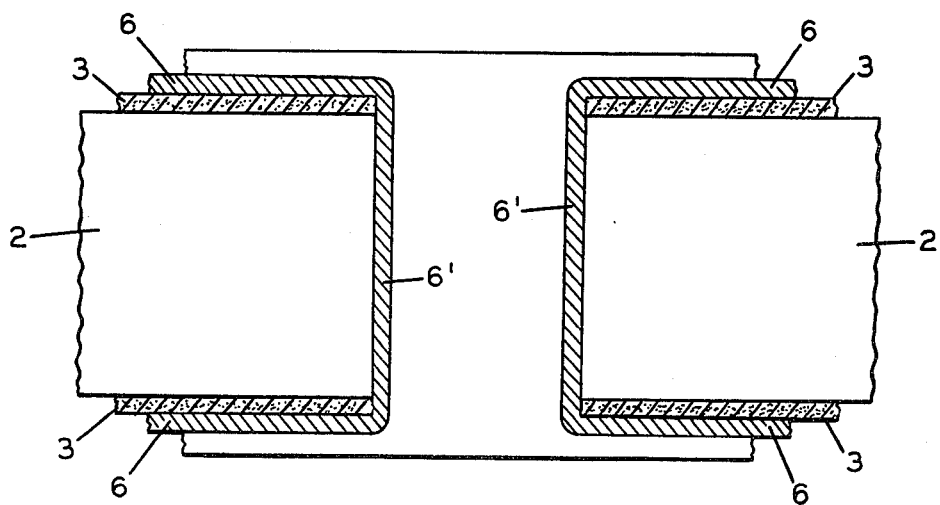

METHOD FOR PRODUCING PRINTED CIRCUIT BOARDS WITH PUNCHED HOLES HAVING METALLIZED WALLS

This invention relates to circuit boards and, more particularly, to a method for producing such boards having holes with metallized walls therein.

Circuit boards of the printed circuit type and having holes with metallized walls are finding increased use. In such circuit boards, the metal coating on the walls of the holes enhances the quality of the soldered junctions between wires inserted in such holes connecting the components with the associated circuit pattern. The metal coating on the hole walls connects the holes to the circuit pattern both electrically and mechanically. In circuit boards having circuit patterns on both sides of the board, the metal wall coating on the holes which pass through such boards serve at the same time or solely for electrically connecting the circuit pattern on one board side with the circuit pattern on the other side.

A particularly useful method of producing printed circuit boards is based on the use of a base material having a surface provided on one or on both sides with an adhesive coating which coating, in turn, is provided with a masking foil. Such a base material is prepared, for example, by coating a laminated pressboard with an adhesive layer. The adhesive layer is applied by dipping or casting or by other known process. The surface of the adhesive coating is then provided in a later process step with a removable masking layer composed of plastic material or metal, preferably aluminum.

Another widely used method for preparing base material comprises the use of a foil, for example aluminum, which is coated with the adhesive material. The foil is combined with the impregnated layers of the laminated pressboard with heat and pressure to form a base material with masking foil and an adhesive layer. Suitable adhesive materials are, for example, phenolic resins modified with synthetic rubber. This is done before holes are provided in the board.

Following the punching or drilling of the holes and the removal of the masking foil, the adhesive coating is rendered microporous and wettable in a known way. This might be accomplished, for example, by subjecting the coating to the action of chromosulphuric acid. This facilitates the build up of the conductor pattern on the adhesive coated surface by means of currentless or electroless metallization alone or in combination with galvanic deposition. Such printed circuit boards have excellent adhesive power or strength between the board and the circuit pattern, including excellent strength during soldering bath temperature conditions.

In connection with the constantly increasing requirements on printed circuit boards because of miniaturization of components, it is found that beads of adhesive material build up on the outlet side of the punched hole during the punching or drilling step by which such holes are prepared. This formation of beads is more severe the smaller the diameter of the holes. In the finished printed circuit board, the metal coating within the zone of the beads results in a weak point which, particularly under the conditions of a thermal shock as in the soldering operation in a mass production, often leads to the formation of cracks in the metal during soldering or the later formation of a defective junction.

In printed circuit boards for use under conditions where strong temperature fluctuations are encountered, for example in the fields of aeronautics and astronautical applications, it is generally necessary to improve the quality of printed circuit boards having so-called fully metallized hole walls. Increased resistance to the formation of fine cracks within the zone of the metallization of the walls of the holes or within the zone of transition connecting between the wall and the circuit pattern on the circuit board surface and the avoidance of operational breakdowns or failures as a result of cyclic temperature loads are of particular importance to a high degree of safety.

It has been discovered that, by the method of the instant invention, the beads of adhesive material around punched or drilled holes in adhesively coated circuit boards might be removed. It has also been discovered that, to a limited extend, the removal of the layer of adhesive material radially starting at the edge of the hole results in circuit boards having distinctive features of extremely high quality and insensitivity with respect to temperature loads.

The method of the instant invention is particularly adapted to circuit board base material for supporting on one or both sides an adhesive layer having a surface provided with a masking foil, for example an aluminum foil.

After the hole pattern has been drilled or punched, the board is subjected to or exposed to an etching agent or solvent for the adhesive coating. An etching agent or solvent which will not attack the masking foil or will attach such foil to an inconsequential extent, is employed. Depending on the type of masking foil material used, suitable solvents or etching agents are, for example, chromic acid and alkaline permanganate solutions, as well as alkali metal hydroxide solutions. The duration of treatment is selected in a way such that the coating of adhesive material is removed underneath the masking foil, preferably up to a radial spacing from the edge of the respective hole conforming at least with the thickness of the adhesive coating.

The masking foil is subsequently removed. Depending on the type of foil material used, such removal can be achieved with the help of suitable etching agent or solvent or by mechanical stripping.

The board blank is subsequently treated in the known way to render the adhesive coating microporous and wettable. The board surface, including the walls of the holes, is subsequently sensitized catalytically for the currentless metal precipitation or electroless metal deposition. A solution containing the reaction product of Pd(II)chloride and Sn(II)chloride may be employed to sensitize the board blank catalytically.

The board blank is then immersed into a bath for the currentless precipitation of metal, for example of copper or nickel. The board blank is left in the bath until a deposit of desired thickness is achieved or of a thickness sufficient for subsequent galvanic metallization has been obtained if subsequent galvanic plating is to be used. A covering mask corresponding with the negative of the desired conductor circuit pattern, for example by phototype or screen stencil printing, is applied. The conductor pattern and, at the same time, the metallization of the walls of the holes, are built up on the board blank to the desired thickness by means to galvanic metal deposition. The covering mask is then removed. A thin, currentlessly or electrolessly deposited metal layer is now exposed on the board blank surface between the circuit pattern and is removed.

If the circuit pattern is to be formed exclusively by currentless metal precipitation or electroless metal deposition, the covering mask is applied immediately after catalytic sensitizing. The board blank is then left in the currentlessly or electrolessly metallizing bath until the circuit pattern has reached the desired thickness.

The method of the instant invention might also be employed with base materials having interspersed therein a substance which acts catalytically on the currentless metal deposition. In this case, the treatment with a sensitizing solution can be omitted.

The method according to the present invention is explained in greater detail with the help of the drawing in which:

FIG. 1 shows, in section, a base material suitable for the method. In this figure, reference number 1 designates the temporarily used masking foil composed of plastic or metal, for example aluminum. Reference number 2 designates the insulating substrate, for example a glass fiber-reinforced epoxy resin laminate board. Reference number 3 represents the adhesive layer. Reference number 4 designates a punched hole having walls which are to be metallized.

Figure 2:
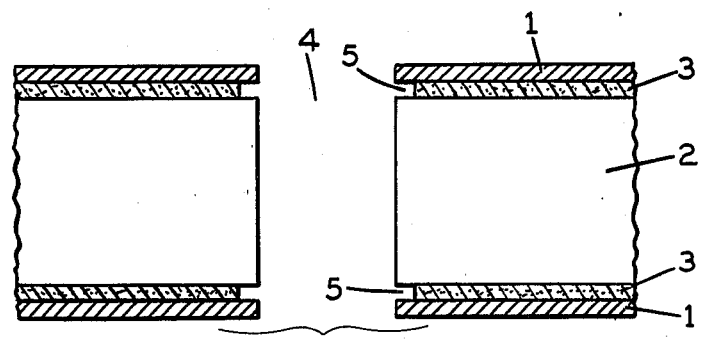

FIG. 2 illustrates the same base material board as shown in FIG. 1 after it has been subjected to a degrading agent removing the adhesive layer 2 starting from hole 4 beneath masking foil 1 to an extent depending on or corresponding with the predetermined duration of action of said agent. There is thus created at such point a zone 5 which is free of adhesive coating.

Figure 3:
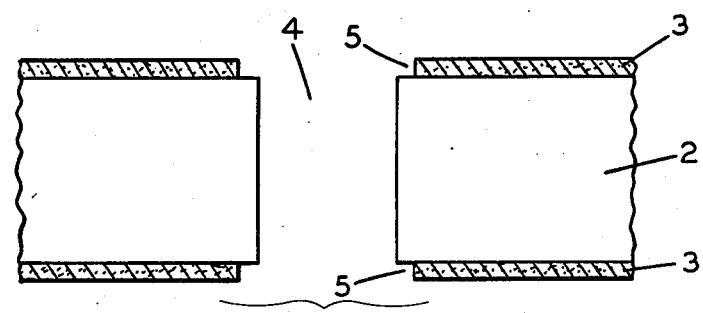

FIG. 3 shows the state the base material board of FIG. 2 after the removal of the masking layer 1.

Figure 4:
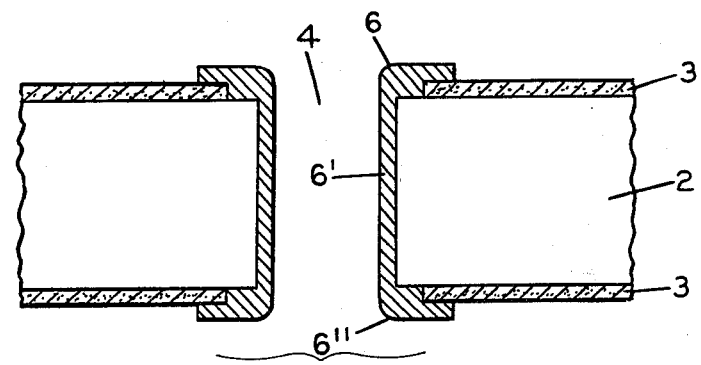

FIG. 4 is an idealized illustration of the section through the finished circuit board of FIG. 3. Here, reference number 6 designates the train of conductors and 6' the metallization of the wall of the hole which, within zone 6'', has been reinforced by largely or partially filling zone 5.

Figure 5:
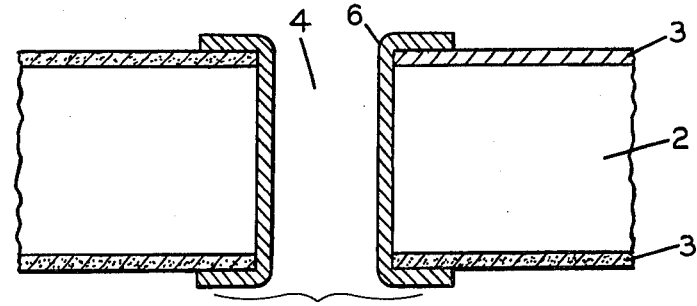

FIG. 5 illustrates a section through a circuit board prepared by the conventional prior art methods without using the process according the the present invention.

Surprisingly, it has been discovered that it is advantageous if the degradation or removal of the adhesive layer and the metallization are adjusted to each other in a way as shown in the cross section illustrated in FIG. 6.

FIG. 7 shows, for comparison purposes with FIG. 6, the section through a circuit board manufactured without using the method according to the present invention.

The terms and expressions which have been employed are used as terms of description and not of limitation, and there is no intention, in the use of such terms and expressions, of excluding any equivalents of the features shown and described or portions thereof, but it is recognized that various modifications are possible within the scope of the invention claimed.

What is claimed is:

1. A method for producing printed circuit boards with holes having metallized walls, in the course of which method metallic coating of the hole walls and the circuit pattern are produced by means of currentless metal precipitation alone or in combination with subsequent galvanic metal deposition, and in which method the initial material is a substrate suitable for the manufacture of printed circuit boards, with the surface of said substrate being provided with an adhesive coating temporarily masked by a metal or plastic foil and forming a base material, characterized by the steps of providing the base material with holes having walls to be metallized; subsequently subjecting the base material with the holes to an etching solution suitable for removing the adhesive coating exposed on the holes without substantially attacking the masking foil; continuing the treatment with said etching solution until there is removed not only any burr or bead of the adhesive coating formed in the production of the holes but, to a limited extent, also the adhesive coating itself around the hole, starting from the edges of the holes and proceeding from the edges beneath the masking foil and forming a recess in the adhesive around the holes and beneath the masking foil; removing the masking foil from the etching solution treated base material; and, treating said treated base material with said masking foil removed with an electroless metal deposition solution to deposit on said base material surface around said holes from which said adhesive coating has been removed and on the walls of said holes a metal deposit.

2. The method of claim 1, characterized by depositing on said electroless metal deposit a galvanic metal deposit.

3. The method as defined in claim 2, characterized by the fact that the adhesive coating is removed within the zone around the edge of the holes under the masking foil at least up to a distance from the edge of the hole conforming with the thickness of the adhesive coating.

4. The method as defined in claim 2, characterized by the fact that the bath serving for the galvanic deposition is highly capable of scatter.

* * * * *